United States Patent [19]

Lord

[11] Patent Number: 4,560,420
[45] Date of Patent: Dec. 24, 1985

[54] METHOD FOR REDUCING TEMPERATURE VARIATIONS ACROSS A SEMICONDUCTOR WAFER DURING HEATING

[75] Inventor: Herbert A. Lord, East Windsor Township, Mercer County, N.J.

[73] Assignee: AT&T Technologies, Inc., Berkeley Heights, N.J.

[21] Appl. No.: 620,246

[22] Filed: Jun. 13, 1984

[51] Int. Cl.⁴ .......................................... H01L 21/265
[52] U.S. Cl. .................... 148/1.5; 29/576 T; 29/576 B; 148/187
[58] Field of Search ................. 29/576 T, 576 B; 148/1.5, 187

[56] References Cited

U.S. PATENT DOCUMENTS

| | | | |
|---|---|---|---|
| 2,057,421 | 10/1936 | Dickson | 219/347 |
| 4,001,047 | 1/1977 | Boah | 148/1.5 |
| 4,041,278 | 8/1977 | Boah | 219/411 |
| 4,081,313 | 3/1978 | McNeilly et al. | 148/175 |
| 4,097,226 | 6/1978 | Erikson et al. | 432/120 |
| 4,101,759 | 7/1978 | Anthony et al. | 219/343 |
| 4,113,547 | 9/1978 | Katz | 156/612 |
| 4,331,485 | 5/1982 | Gat | 148/1.5 |
| 4,468,259 | 8/1984 | Mimura | 148/175 |
| 4,468,260 | 8/1984 | Hiramoto | 29/576 T |
| 4,469,529 | 9/1984 | Mimura | 29/576 B |
| 4,482,395 | 11/1984 | Hiramoto | 148/1.5 |

FOREIGN PATENT DOCUMENTS

| | | | |
|---|---|---|---|
| 0064936 | 4/1982 | Japan | 29/576 T |
| 0064937 | 4/1982 | Japan | 29/576 T |
| 0208146 | 12/1982 | Japan | 29/576 T |

*Primary Examiner*—Upendra Roy
*Attorney, Agent, or Firm*—R. B. Levy

[57] ABSTRACT

Temperature variations across the surface of a semiconductor wafer (12), having at least one major surface thereof exposed to a source of radiant heat energy (18), are reduced by positioning a reflective ring (30, 30', 30" or 30''') proximate the wafer edge (28). The reflective ring (30, 30', 30" or 30''') reflects the heat energy towards the wafer periphery (27) to provide substantially uniform heat across the wafer.

3 Claims, 7 Drawing Figures

METHOD FOR REDUCING TEMPERATURE VARIATIONS ACROSS A SEMICONDUCTOR WAFER DURING HEATING

TECHNICAL FIELD

This invention relates generally to a method for processing a semiconductor wafer.

BACKGROUND OF THE INVENTION

In the processing of semiconductor wafers, wafer heating is required to accomplish one or more device fabrication techniques such as rapid thermal annealing (RTA), temperature gradient zone melting (TGZM), lateral epitaxial growth on oxide (LEGO) or high temperature recrystallization (HTR). Such heating is typically accomplished by placing the wafer on the ends of a plurality of pins which project from the floor of an oven. A bank of tungsten lamps is mounted in the upper portion of the oven for heating one major surface of the wafer. The opposing major surface of the wafer is exposed to the floor of the oven. The floor of the oven is often cooled by cooling coils or the like so that the opposing major surface of the wafer is made cooler than the major surface of the wafer exposed to the heat from lamps. Thus, a temperature gradient is established through the wafer which is very desirable in achieving TGZM, LEGO and HTR. Examples of ovens of this type for heating semiconductor wafers are disclosed in U.S. Pat. Nos. 4,001,047; 4,041,278; 4,097,226 and 4,101,759.

Non-uniform lateral heating is generally undesirable since temperature variations across the wafer cause difficulties during wafer processing. For example, during heating of the wafer to accomplish temperature gradient zone melting, temperature variations across the wafer can lead to distortion of the migration pattern of the dopant. Uneven heating during the lateral epitaxial growth over oxide process can result in non-uniform melting across the wafer. More generally, lateral temperature variations across the wafer can result in substantial stresses on the wafer which can cause slip therein, that is, non-elastic deformation of the wafer lattice.

In an attempt to attain uniform lateral heating, known ovens may be provided with a diffuser situated between the wafer and the bank of lamps to uniformly distribute the heat across the wafer. Further, reflectors may be provided on the oven floor to reflect heat generally towards the wafer rather than to any specific portion of the wafer. However, with known ovens, uneven heating of the wafer often occurs because heat is lost from the edge of the wafer both by radiation and convection. It has been determined that more heat is lost from the periphery of the wafer by convection than by radiation except in a vacuum environment. Convective heat losses cause the periphery to be considerably cooler than the central portion as compared to the temperature difference between the periphery and the central portion of the wafer caused by radiation losses. The periphery of the wafer is defined as the generally annular area proximate the wafer edge.

Accordingly, there is a need for a technique for reducing lateral temperature variations across a semiconductor wafer during heating.

SUMMARY OF THE INVENTION

The aforementioned problems have been overcome by the present method of reducing the temperature variations across a semiconductor wafer during heating. The method comprises the steps of exposing one major surface of the wafer to a source of radiant heat energy and reflecting the radiant heat energy towards selected areas of the wafer to reduce temperature variation thereacross.

DETAILED DESCRIPTION

Figure 1:
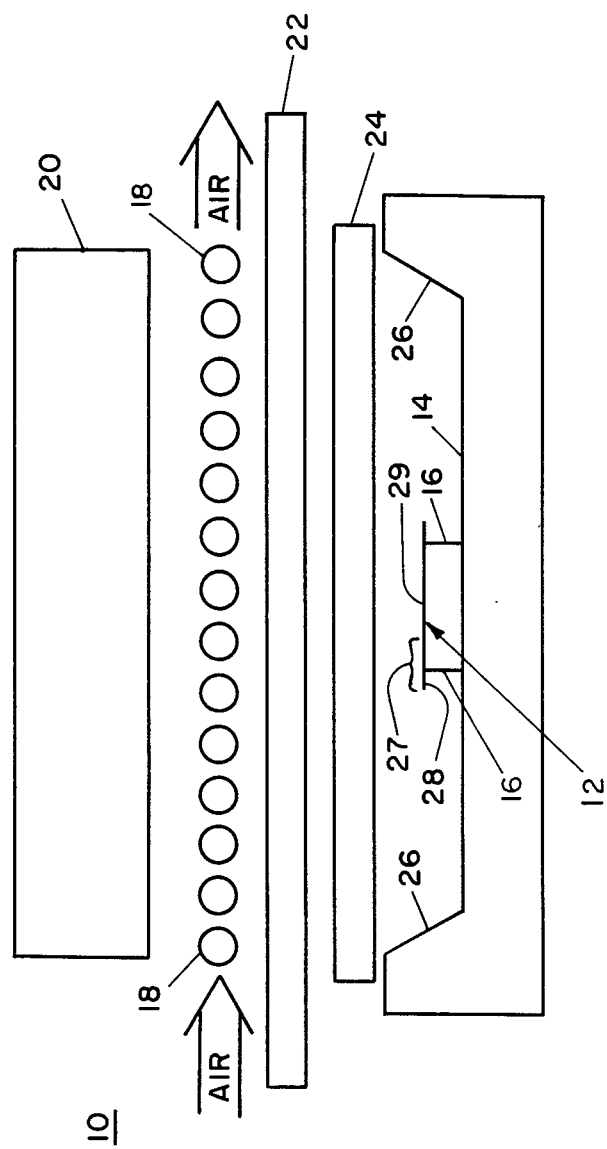
FIG. 1 is a simplified schematic view, taken in cross section, of an oven for heating a semiconductor wafer.

FIG. 1 is a cross-sectional, schematic view of a known oven 10 of the type used for heating a semiconductor wafer 12 to accomplish thermal gradient zone melting (TGZM), rapid thermal annealing (RTA), the lateral epitaxial growth over oxide (LEGO) process, high temperature recrystallization (HTR), or similar processes. The oven 10 includes a floor 14 from which the wafer 12 is supported by a plurality of upstanding pins 16—16. The pins 16—16 are typically one-half inch in length and are fabricated from a heat-resistant material such as quartz or the like. A heat source, which usually takes the form of a bank tungsten-halogen lamps 18—18 cooled by air flowing therepast, is located in the upper portion of the oven 10. A reflector 20 may be positioned above the tungsten-halogen lamps 18—18 to reflect the heat radiated by the lamps towards the wafer 12.

First and second spaced-apart quartz plates 22 and 24 are interposed between the wafer 12 and the lamps 18—18. The plates 22 and 24 serve to separate the rapidly flowing air which cools the lamps from the wafer 12. The perimeter of the floor 14 of the oven 10 is joined to a smoothly polished upwardly and outwardly sloping wall 26 which serves as a reflector to generally direct heat back towards the wafer 12. Thus far described, the oven 10 is conventional in its construction and its operation.

While the oven 10 is designed to achieve fairly uniform heating, temperature variations across the wafer 12 nevertheless exist. Such temperature variations occur as a result of heat being lost by radiation and convection from the periphery 27 of the wafer 12, that is, the generally annular area proximate the edge 28 of the wafer 12. Thus, the wafer 12 tends to be cooler at the periphery 27 than at the central portion 29 thereof. The temperature variation across the wafer 12 causes stresses therein which may be large enough to cause slip. Moreover, when the wafer 12 is heated in the oven 10 to achieve temperature gradient zone melting, temperature variations across the wafer may result in an undesirable distortion of the dopant migration pattern. During heating of the wafer 12 in the oven 10 to achieve lateral epitaxial growth over oxide, temperature variations across the wafer may result in non-uniform melting, which is also very undesirable.

Figure 2:
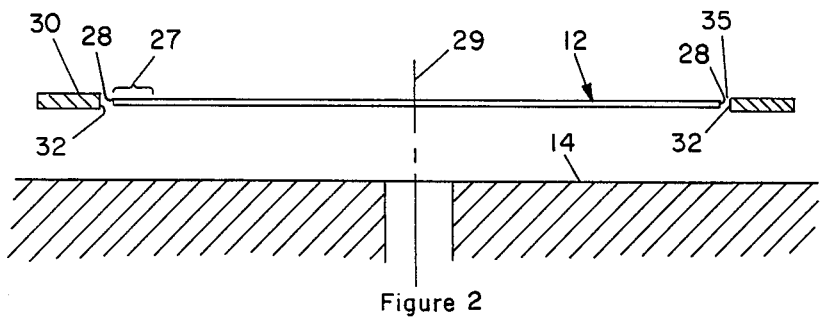
FIGS. 2-5 each illustrate exemplary embodiments of the instant invention.

To reduce lateral temperature variations, the periphery 27 of the wafer 12 must be maintained at approximately the same temperature as the central portion 29 of the wafer. FIG. 2 illustrates a first embodiment of the use of a reflective ring 30 for maintaining the periphery 27 at approximately the same temperature as the central portion 29 during heating of the wafer 12.

In practice, the reflective ring 30 is typically fabricated from an annular silicon, or silicon-carbide disk, which is approximately 1 to 2 millimeters thick so as to be thicker than the wafer 12 which is approximately $\frac{1}{2}$ millimeter thick. When the diameter of wafer 12 is 4 inches, the outer diameter of the ring 30 is typically 5.12 inches whereas the diameter of the aperture 35 of the ring 30 is 4.12 inches. The reflective ring 30 is supported from the floor 14 of the oven 10 by pins (not shown) similar in construction to the pins 16—16 of FIG. 1 so that the reflective ring 30 is concentric about, and lies co-planar with, the wafer 12.

When the wafer 12 is heated with the ring 30 positioned concentric thereabout and co-planar therewith, the heat radiated substantially laterally from the periphery 27 tends to be reflected by the inside wall 32 of the ring 30 primarily back towards the wafer edge 28. Because of the relatively narrow gap between the edge 28 of the wafer and the inside wall 32 of the ring 30, the ring also insulates the periphery 27 against heat loss. Further the ring 30 alters the heat lost from the periphery 27 by convection by interfering with gases flowing past the periphery 27 of the wafer 12. Moreover, the reflective ring 30 also absorbs some heat from the lamps 18—18 of FIG. 1 and radiates heat towards the wafer edge 28 to heat the periphery 27, further reducing temperature variations across the wafer 12 during heating.

The greater thickness of the reflective ring 30, as compared to the wafer 12, causes the ring to heat more slowly and cool more slowly. The relatively slower temperature response of the ring 30 tends to aid in maintaining the temperature of the wafer 12 substantially constant notwithstanding sudden variations in the temperature of the oven 10. However, the temperature lag in the ring 30 may be disadvantageous when the wafer 12 is rapidly heated and cooled (within a matter of seconds) to achieve rapid thermal annealing. For this reason, the reflective ring 30 has not been found to be very effective to reduce temperature variations across the wafer 12 during rapid thermal annealing.

Figure 3:
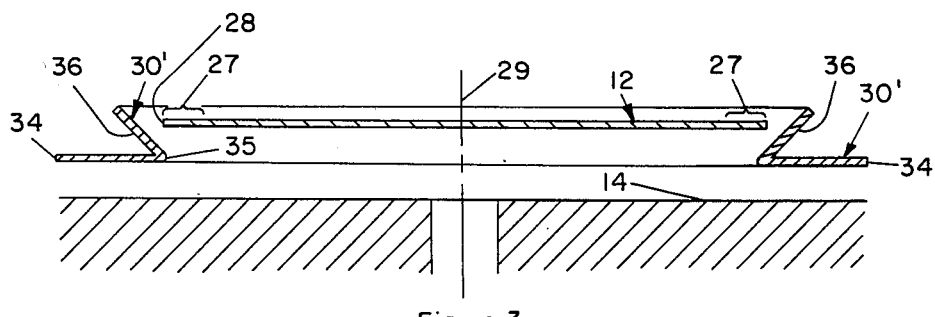

FIG. 3 illustrates another embodiment of a reflective ring 30' for reducing temperature variations across the semiconductor wafer 12 during heating in the oven 10 of FIG. 1. The reflective ring 30' comprises an annular base plate 34 of silicon carbide or silicon. The base plate 34 has an aperture 35 therethrough in registration with the wafer 12. The diameter of the aperture 35 is typically, although not necessarily, smaller than the wafer diameter, typically 4 inches, whereas the outer diameter of the base plate 34 is greater than the wafer 12 diameter. A wall 36, fabricated from silicon or silicon carbide, is joined to, and slopes upwardly and radially outwardly from, the periphery of the aperture 35 in the base plate 34.

The reflective ring 30' is supported from the oven floor 14 by pins (not shown) so that the base plate 34 of the reflective ring 30' lies below, and the top of the wall 36 rises above, the wafer 12. When the reflective ring 30' is positioned in spaced registration with the wafer 12 in this manner, the wall 36 of the reflective ring 30' advantageously selectively reflects heat radiated from the lamps 18—18 of FIG. 1 towards the periphery 27. The ring 30 also reflects the heat radiated from the wafer 12 back towards the periphery 27. Further, during heating, the wall 36 of the reflective ring 30' of FIG. 3 absorbs some radiant energy from the lamps 18—18 of the oven 10 of FIG. 1 and radiates heat towards the periphery 27 of the wafer 12. By reflecting and radiating heat primarily towards the periphery 27 of the wafer 12, the reflective ring 30' of FIG. 3 maintains the temperature of the periphery 27 substantially the same as the temperature of the central portion 29 during the heating of the wafer. Also, like ring 30 of FIG. 2, the ring 30' of FIG. 3 interferes with gases flowing past the periphery 27 of the wafer 12 to alter the heat lost from the periphery 27 by convection.

Figure 6:
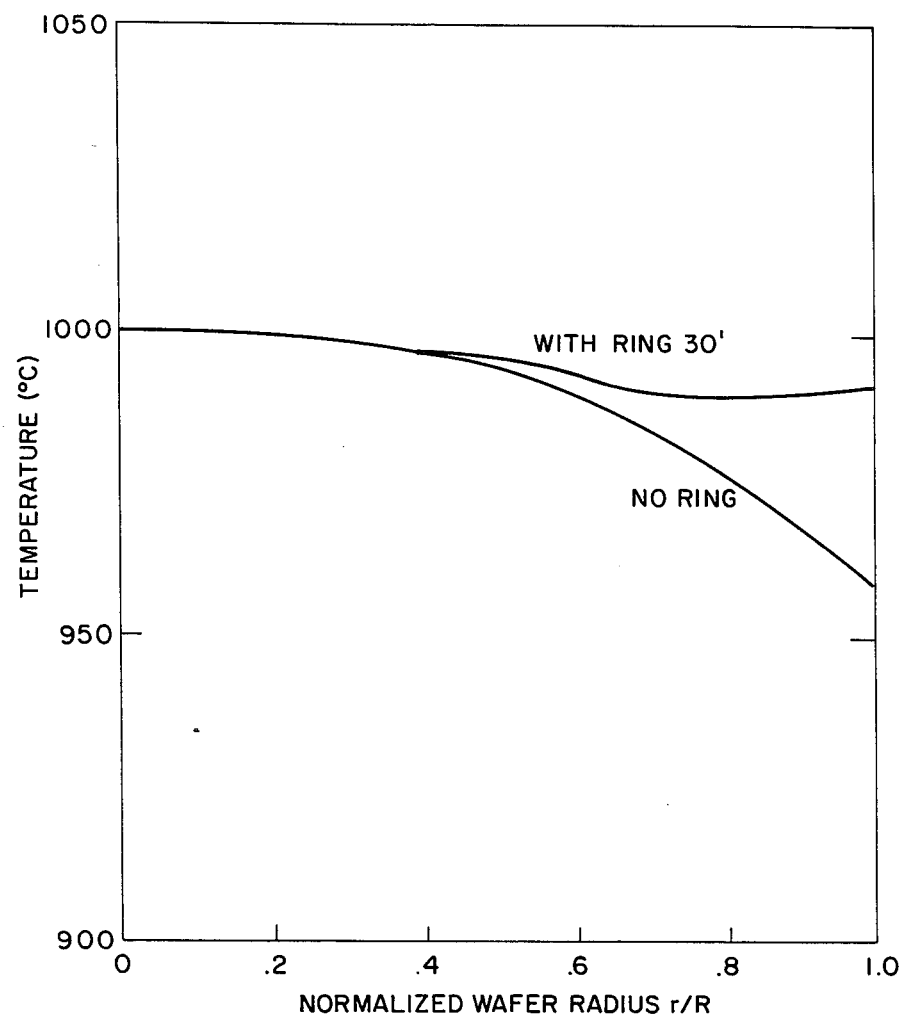
FIG. 6 is a graphical representation of the temperature profiles across a semiconductor wafer.

In FIG. 6, there is shown a graphical representation of the peak temperature profile across the wafer 12 during heating with no reflective ring 30' and during heating with the reflective ring 30' of FIG. 3 positioned in spaced registration therewith. The unit of measurement of the abscissa of the graphical representation of FIG. 3 is the normalized wafer radius and is given by the ratio r/R where R is the radius of the wafer 12 (typically 2 inches) and where r is a radial variable which takes on values between O and R. As can be seen from FIG. 6, the temperature difference between the central portion 29 of the wafer 12 and the edge 28 is expected to be much greater when the wafer 12 is heated without the reflective ring 30' than when the wafer is heated with the reflective ring 30'.

Figure 4:
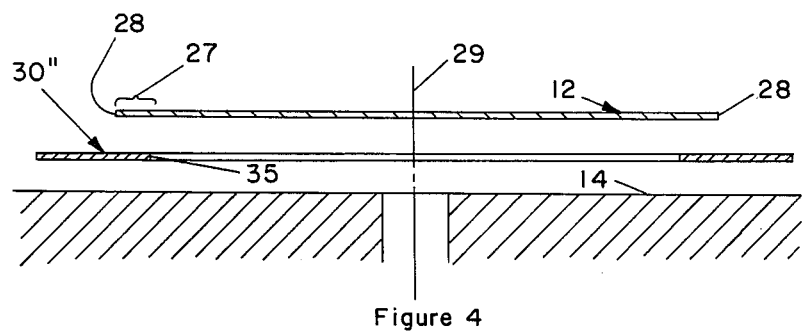

FIG. 4 illustrates yet another embodiment of a reflective ring 30" for reducing the temperature variations across the wafer 12 during the heating of the wafer 12 in the oven 10 of FIG. 1. The reflective ring 30" of FIG. 4 typically takes the form of an annular silicon or silicon carbide plate which is approximately of the same thickness as the wafer 12. The aperture 35 through the reflective ring 30" is of a diameter which is similar in size to the wafer 12, whereas the outer diameter of the reflective ring 30" is larger than that of the wafer. The reflective ring 30" is supported by pins (not shown), typically $\frac{1}{4}$ inch in length extending upwardly from the oven floor 14, so that the ring is in spaced relation below the wafer 12. Like the reflective ring 30 of FIG. 2 and the reflective ring 30' of FIG. 3, the reflective ring 30" of FIG. 4 reflects heat radiated from the lamps 18—18 of FIG. 1 towards the periphery 27 of the wafer 12. The ring 30" also reflects radiated heat from the wafer 12 back towards the periphery 27. Further, the reflective ring 30" absorbs heat from the lamps 18—18 of the oven 10 of FIG. 1 and radiates heat towards the periphery 27 of the wafer 12. In addition, the reflective ring 30" insulates the periphery 27 of the wafer from the oven floor 14. Moreover, the ring 30" alters the gas flow pattern proximate the periphery 27 to alter convective heat losses. Thus, the reflective ring 30" helps reduce cooling of the periphery 27 of the wafer 12 to further reduce temperature variations across the wafer 12.

Figure 7:
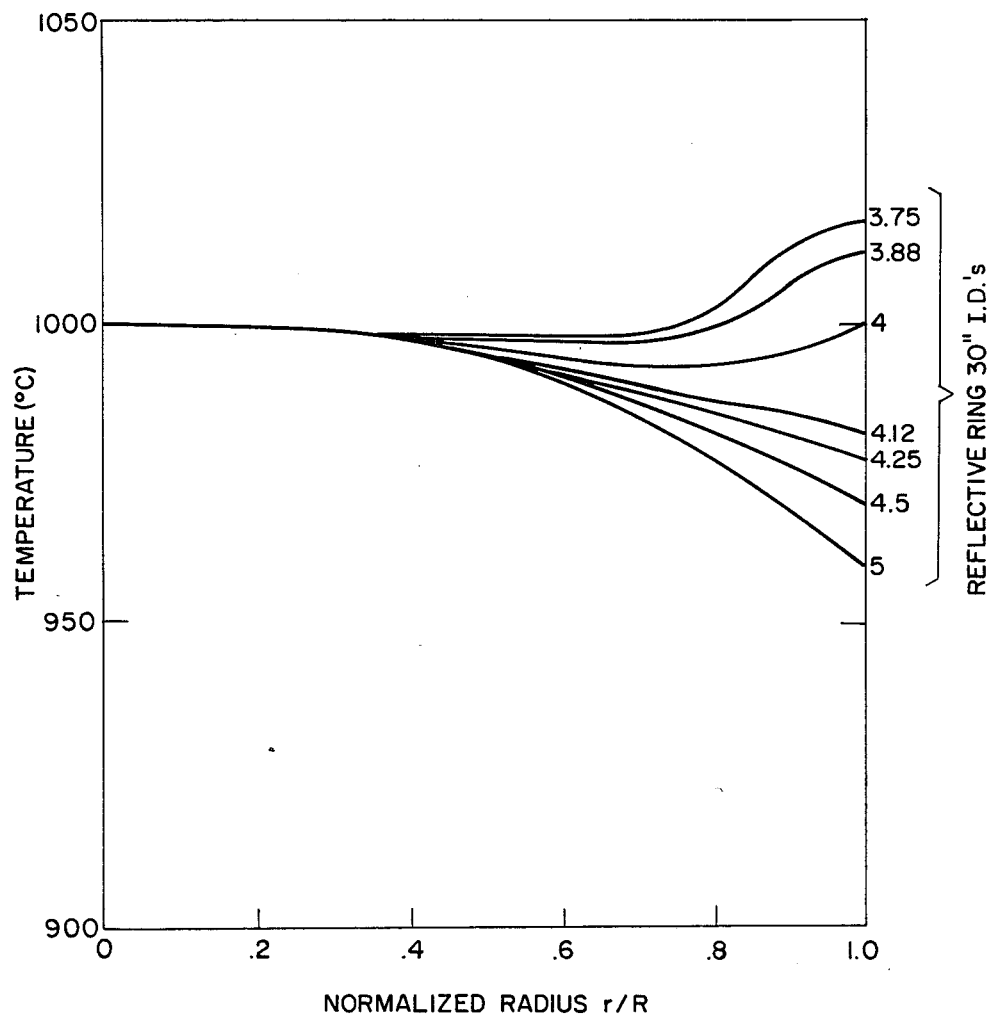
FIG. 7 is a graphical representation of the wafer temperature profiles obtained by using differing sized reflective rings of the type illustrated in FIG. 4.

FIG. 7 is a graphical representation of the temperature profiles across a 4 inch diameter wafer 12 which would be expected by the use of individual reflective rings 30" of the type illustrated in FIG. 4, each having a 5 inch outer diameter and different inner diameters. As can be observed, the best results can be expected by making the inner diameter of the reflective ring 30" approximately 4 inches.

Figure 5:
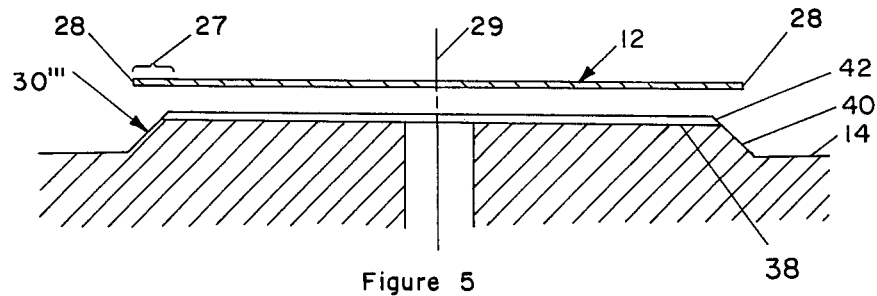

FIG. 5 represents yet another embodiment of a reflective ring 30''' for reflecting radiant heat towards the periphery 27 to reduce temperature variations across the wafer. The reflective ring 30''' is comprised of a raised region 38, typically ¼ inch in height, on the oven floor 14 directly beneath the wafer 12. The area of the raised region 38 on the oven floor 14 is slightly smaller than the area of the wafer 12 so that the periphery 27 of the wafer overlies the perimeter wall 40 of the raised region 38. The perimeter wall 40 of the raised region 38 is made diffusely reflective and slopes downwardly from the top of the raised region 38 to the floor 14, typically at a 45° angle. Radiant heat energy from the lamps 18—18 of FIG. 1 which lie above opposite sides of the wafer 12 strikes the wall 40 and is reflected thereby towards the periphery 27. The wall 40 also reflects some of the heat radiated from the periphery 27 back towards the periphery to reduce temperature variations across the wafer 12 during heating.

In practice, the top surface of the raised region 38 is made non-reflective by applying a heat-absorptive black coating 42 thereon. The thickness of coating 42 has been exaggerated for purposes of illustration. The absorptive coating 42 greatly reduces the reflection and radiation of heat by the raised region 38 towards the central portion 29 of the wafer 12.

Moreover, the raised region 38 on the oven floor 14 tends to be cooler than the central portion 29 of the wafer 12 during wafer heating. Since the raised region 38 of the oven floor 14 is positioned closer to the central portion 29 of the wafer 12 than to the periphery 27, the raised region 38 tends to cool the central portion 29 more than the periphery 27 of the wafer. In this way, the raised region 38 of the oven floor 14 further reduces temperature variations across the wafer 12.

The reflective ring 30''' has an advantage over the reflective rings 30, 30' and 30'' of FIGS. 2–4, respectively, which are each formed of a silicon or silicon-carbide structure. Unlike the reflective rings 30, 30' and 30'' shown in FIGS. 2–4, respectively, the reflective ring 30''' of FIG. 5 undergoes very little, if any, thermal cycling during the heating of the oven 10. The relative temperature stability of the reflective ring 30''' is very desirable especially during wafer heating to achieve rapid thermal annealing.

It is to be understood that the embodiments described herein are merely illustrative of the principles of the invention. Various modifications may be made thereto by persons skilled in the art which will embody the principles of the invention and fall within the spirit and scope thereof.

What is claimed is:

1. A method for achieving lateral growth over oxide or a semiconductor wafer having first and second major surface comprising the steps of:
    exposing only the first surface of the wafer to a source of radiant energy; and
    providing a body spaced from the second surface of the wafer distal from the source of radiant heat energy for reflecting radiant heat energy towards selected areas of the wafer to reduce temperature variations thereacross.

2. The method according to claim 1 characterized by the body absorbing and radiating radiant heat energy and further including the step of directing at least some of the heat radiated by the body primarily towards selected areas of the wafer.

3. The method according to claim 1 characterized by exposing the central area of the wafer to a temperature cooler than the wafer periphery to further achieve temperature uniformity across the wafer.

* * * * *